(12) United States Patent
Oikawa

(10) Patent No.: US 7,781,894 B2
(45) Date of Patent: Aug. 24, 2010

(54) SEMICONDUCTOR DEVICE AND MANUFACTURING METHOD OF SAME

(75) Inventor: Takahiro Oikawa, Gunma (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 62 days.

(21) Appl. No.: 11/634,376

(22) Filed: Dec. 6, 2006

(65) Prior Publication Data
US 2007/0132017 A1  Jun. 14, 2007

(30) Foreign Application Priority Data
Dec. 6, 2005 (JP) .............................. 2005-352424
Nov. 16, 2006 (JP) .............................. 2006-310622

(51) Int. Cl.
H01L 23/48 (2006.01)
H01L 23/52 (2006.01)
H01L 29/40 (2006.01)

(52) U.S. Cl. .................. 257/774; 257/698; 257/510; 257/E29.119

(58) Field of Classification Search ................ 257/327, 257/330, 275–277, 301–309, 528, 531–534, 257/728, 773, 774, 510, 698, E21.375, E23.011, 257/E23.015, E23.039, E23.044, E29.044, 257/E29.114, E29.119, E29.184, E25.013, 257/E21.705; 333/246, 247
See application file for complete search history.

(56) References Cited

U.S. PATENT DOCUMENTS

| | | | | |
|---|---|---|---|---|
| 3,903,427 A | * | 9/1975 | Pack | 250/208.2 |
| 5,225,707 A | * | 7/1993 | Komaru et al. | 257/513 |
| 5,614,743 A | * | 3/1997 | Mochizuki | 257/276 |
| 6,392,290 B1 | | 5/2002 | Kasem et al. | |
| 6,545,318 B1 | * | 4/2003 | Kunikiyo | 257/349 |
| 6,639,275 B2 | * | 10/2003 | Ninomiya | 257/330 |
| 2005/0113895 A1 | | 5/2005 | Danzl et al. | |
| 2007/0032061 A1 | * | 2/2007 | Farnworth et al. | 438/597 |

FOREIGN PATENT DOCUMENTS

| | | |
|---|---|---|
| EP | 1564806 | 8/2005 |
| JP | 63-194367 | 8/1988 |
| JP | 2002-353452 | 12/2002 |
| JP | 2004-363302 | 12/2004 |

OTHER PUBLICATIONS

European Search Report mailed on Nov. 10, 2008 directed at counterpart application No. 06025210.3; 8 pages.

* cited by examiner

*Primary Examiner*—Lynne A Gurley
*Assistant Examiner*—Meiya Li
(74) *Attorney, Agent, or Firm*—Morrison & Foerster LLP

(57) ABSTRACT

The characteristic of the semiconductor device of this invention is that the device has a piercing hole 10 formed in the semiconductor layer to touch a first metal film 18, a insulating film 12 formed on the side wall of the piercing hole 10, a second metal film 13 disposed on the first metal film 18 at the bottom of the piercing hole 10 where the insulating film 12 has not been formed and on the semiconductor layer, a barrier metal film 14 formed on the insulating film 12 in the piercing hole 10 and on the first metal film 18, and a wiring layer 15 formed inside the piercing hole 10 through the barrier metal film 14.

8 Claims, 8 Drawing Sheets

SEMICONDUCTOR DEVICE AND MANUFACTURING METHOD OF SAME

CROSS-REFERENCE OF THE INVENTION

This invention is based on Japanese Patent Application Nos. 2005-352424 and 2006-310622, the contents of which are incorporated herein by reference in their entirety.

BACKGROUND OF THE INVENTION

1. Field of the Invention

This invention relates to a semiconductor device and its manufacturing method, especially to the semiconductor device with a piercing hole.

2. Description of the Related Art

A conventional semiconductor device is explained with reference to FIG. 14 by using an up-drain type MOS transistor with a trench configuration as an example.

An epitaxial layer 52 is formed, for example, on a semiconductor substrate 51 made of an N type silicon and a P type diffusion layer 53 (channel region CH) is formed on the surface of the epitaxial layer 52, as shown in FIG. 14. A trench 54 extending from the surface of the P type diffusion layer to the predetermined depth of the epitaxial layer is also formed. A conduction layer made of a poly-silicon film surrounded by an insulating film 55 is buried in the trench 54, configuring a gate electrode (G) 56.

Additionally, an N type source layer 57 adjacent to the insulating film 55 is disposed at the both side walls of the trench 54 on the surface of the epitaxial layer 52. A P type body layer 58 (BD) is disposed to bridge the two source layers adjacent to each other.

Also, a drain layer 59 made of N type impurity is formed to extend from the surface of the epitaxial layer 52 to the predetermined depth of the semiconductor substrate 51.

A source electrode (S) 60 made of, for example, aluminum (Al) alloy covering the source layer 57 and a drain electrode (D) 61 made of aluminum (Al) alloy covering the drain layer 59 are formed on the epitaxial layer 52.

A metal film 62 is disposed on the back surface of the semiconductor substrate 51, completing a semiconductor device 63.

The relevant technology is disclosed in the Japanese Patent Application Publication No. 2004-363302.

An electric current I2 goes through from the source electrode 60, the epitaxial layer 52, to the semiconductor 51, then goes through inside the metal film 62, and goes again through the semiconductor substrate 51 to the drain electrode 61 in an up-drain type MOS transistor with a trench mentioned above, along with the arrow shown in FIG. 14.

However, the resistance value of the semiconductor device becomes high since the electric current goes through the part of semiconductor substrate 51, where the resistance value is high because of the absence of the epitaxial layer 52, twice. Therefore, there is a problem of not being able to lower the resistance value of the semiconductor device.

SUMMARY OF THE INVENTION

The characteristics of this invention are as follows. The semiconductor device of this invention has a semiconductor substrate of first conductivity type with a piercing hole piercing the substrate from the front surface to the back surface and a source layer formed on the front surface, a first metal film formed on the back surface of the semiconductor substrate covering the piercing hole, and a drain layer formed inside of the piercing hole and electrically connected to the first metal film. The drain layer is formed on the front surface of the semiconductor substrate and includes a second metal film that makes contact with the front surface of the semiconductor substrate.

The semiconductor device of this invention also has a piercing hole piercing the substrate from the front surface to the back surface and a source layer formed on the front surface, a drain electrode formed on the front surface of the semiconductor substrate covering the piercing hole, and a drain layer formed inside of the piercing hole and electrically connected to the drain electrode. The drain layer is formed on the back surface of the semiconductor substrate and includes a second metal film that makes contact with the back surface of the semiconductor substrate.

The manufacturing method of the semiconductor device of this invention includes a process of preparing a semiconductor substrate of first conductivity type with a source layer and a drain electrode, a process of forming a piercing hole piercing the substrate from the back surface to the drain electrode, a process of forming a drain layer formed inside of the piercing hole and electrically connected to the drain electrode. The process of forming the drain layer includes a process of forming a second metal film that makes contact with the back surface of the semiconductor substrate.

DETAILED DESCRIPTION OF THE INVENTION

Figure 1:
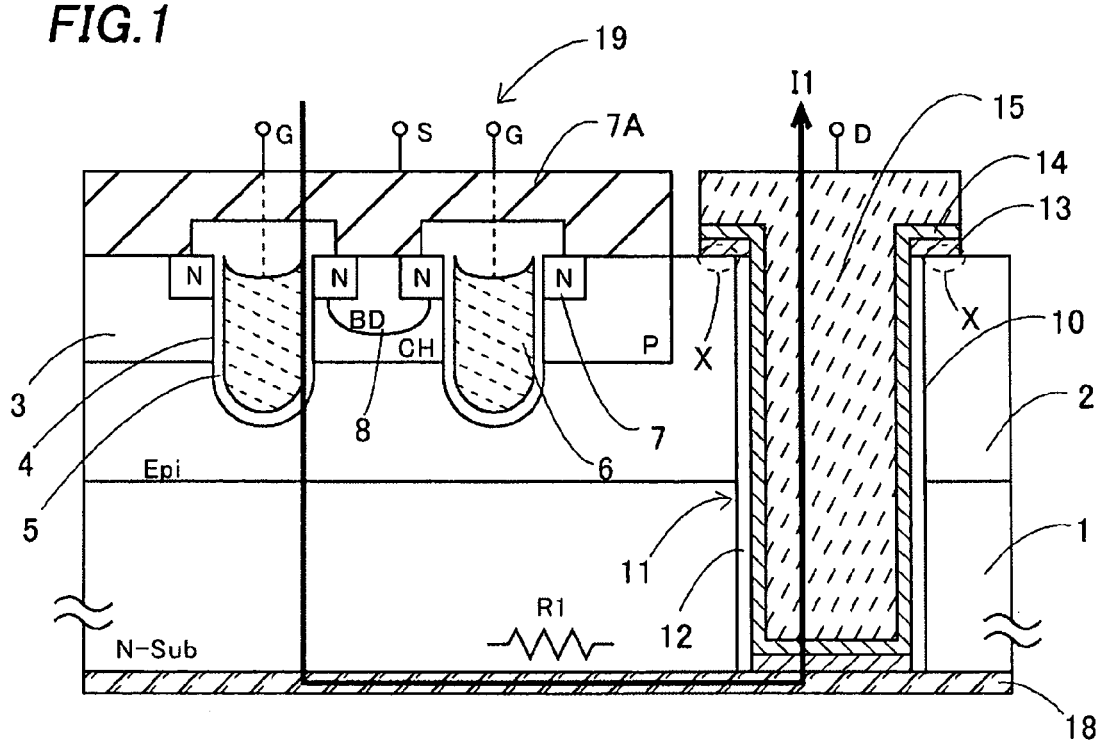
FIG. 1 is the cross-sectional view of the semiconductor device of the first embodiment of this invention.

The first embodiment of the semiconductor device and its manufacturing method of the semiconductor device will be explained by referring to the drawings.

The semiconductor device of this invention will be explained by using an up-drain type MOS transistor of the trench configuration as an example.

An N type epitaxial layer 2 is disposed on a semiconductor substrate 1 of first conductivity type, for example, a substrate made of N type silicon, as shown in FIG. 1. A P type diffusion layer 3 (a channel region CH) is formed on the surface of the epitaxial layer 2. In this embodiment, the thickness of the epitaxial layer 2 is 10 μm, the thickness of the semiconductor substrate 1 including the epitaxial layer 2 is 200 μm, and the thick ness of the P type diffusion layer 3 is 1-1.5 μm.

A trench 4 is formed from the surface of the P type diffusion layer 3 to the predetermined depth of the epitaxial layer 2. A conduction layer made of a poly-silicon film surrounded with an insulating film 5 is buried inside of the trench 4, forming a gate electrode (G) 6. Here, the depth of the trench is, for example, 2 μm and the diameter of the opening in the center of the trench 4 is 0.4 μm.

N type source layers 7 adjacent to the insulating film 5 are disposed at the both side walls of the trench 4 on the epitaxial layer 2. A P type body layer 8 (BD) is also disposed to bridge the N type source layers 7 located next to each other. A source electrode 7A (S) made of, for example, aluminum (Al) alloy film is formed on each of the source layer 7.

A piercing hole 10 with the opening diameter of 60-70 μm is formed piercing from the surface of the epitaxial layer 2 to reach the back surface of the semiconductor substrate. A drain layer 11 with a piercing electrode configuration is formed inside the piercing hole 10. The piercing electrode is formed as follows in the ordinary manufacturing method; that is, an insulating film is formed on the semiconductor substrate including the inside of the piercing hole; and a part of the insulating film at the bottom of the piercing hole is removed to expose the metal film at the bottom, electrically connecting the piercing electrode to the metal film.

However, electric current goes through from the source electrode formed on the surface of the semiconductor substrate to the inside of the semiconductor substrate, reaching the drain electrode formed also on the surface of the semiconductor substrate, in the MOS transistor with the up-drain configuration. Therefore, the device characteristics are deteriorated in such a semiconductor device, because a capacitance is built up at the area where the insulating film is present, that is, the area inside the piercing hole as well as on the semiconductor substrate.

Therefore, this embodiment of the invention relates to the piercing electrode processing, in which the insulating film mentioned above is not involved. It becomes clear that there is a difference between the barrier metal film that is formed on the insulating film that has been formed on the semiconductor substrate and the barrier metal film that is formed directly on the semiconductor substrate with no insulating film. That is, the thickness of the formed barrier metal film is less than half when the barrier metal film made of, for example, TiN film is formed directly on the semiconductor substrate through the CVD (Chemical Vapor Deposition) method, compared to the case where the TiN film is formed on the semiconductor substrate with the insulating film such as silicon oxide film between them.

According to the related experiments, an undesirable film is formed between the semiconductor substrate and the TiN film when the TiN film is formed directly on the semiconductor substrate through CVD method due to the chemical reaction during the CVD processing. The composition of the undesirable film is not known. However, it is clear that the desirable thickness and desirable quality of the TiN film can not be acquired because of the presence of the undesirable film. Therefore, it is difficult to acquire the expected semiconductor device based on the expected design, failing to achieve the semiconductor device with the expected property.

Figure 3:
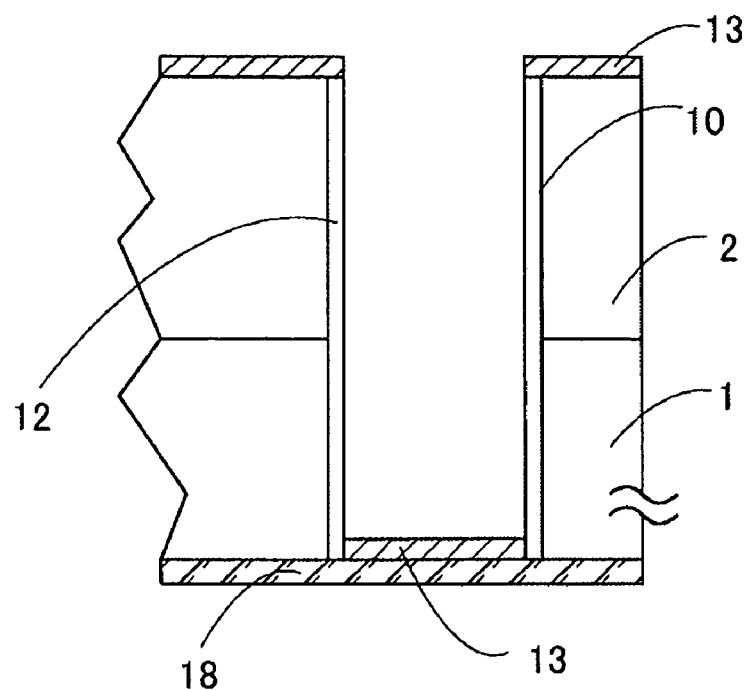
FIGS. 3 to 5 are the cross-sectional views of the manufacturing method of the semiconductor device of the first embodiment of this invention.

The embodiment explained hereinafter is developed to solve this problem. An insulating film 12, made of silicon oxide film or silicon nitride film is formed inside the piercing hole 10, as shown in FIG. 3. The part of the insulating film 12 is removed from the bottom of the piercing hole 10 and from the surface of the semiconductor substrate 1 through anisotropic etching. The insulating film 12 remains only on the side wall of the piercing hole 10. The part of the insulating film 12 on the epitaxial layer 2 is also removed together with the insulating film on the bottom of the piercing hole 10 when the insulating film 12 on the bottom of the piercing hole 10 is removed through over-etching, in this embodiment.

A second metal film made of, for example, Ti film 13 is disposed on the bottom of the piercing hole 10 on a first metal film 18 and on the surface of the semiconductor substrate 1 through sputtering method, as shown in FIG. 3. Thin Ti film with the thickness of about 100 Å is formed as a second metal film 13 in this embodiment in order to form the second metal film 13 only on the bottom of the piercing hole on the first metal layer 18 and on the epitaxial layer 2, not on the insulating film 12 formed on the side wall of the piercing hole 10. It is desirable to form the second metal layer 13 only on the epitaxial layer 2.

It is also possible to form a Ti film with the thickness of about 100-500 Å as the second metal film 13. In this case, the Ti film is sometimes formed on the insulating film 12 and the epitaxial layer 2. Therefore, it may be desirable to remove the Ti film by using a resist from the area where the Ti film is not needed.

While a Ti film is used as the second metal layer 13 in this embodiment, a metal film with a high melting point such as the film made of chrome (Cr) or vanadium (V) can be used as the second metal film. The material which is usually applied as the barrier metal film (for example, tantalum (Ta), tungsten (W), zirconium (Zr)) can be also used for the second metal film. The manufacturing method of the second metal film is not limited to the sputtering method mentioned above. It can be any thin film manufacturing methods (for example, the evaporation method) other than the CVD method.

Figure 4:
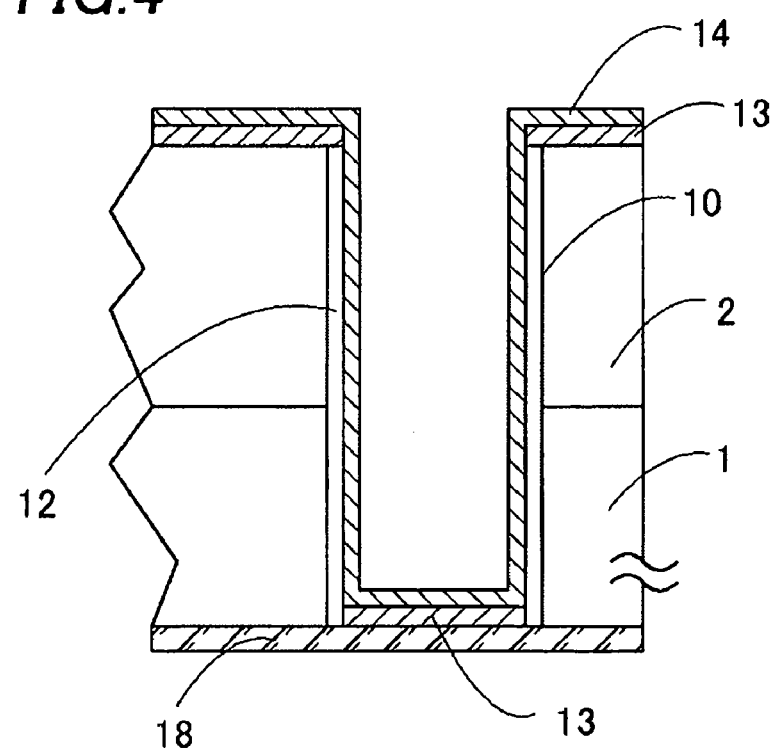

Next, a barrier metal film 14 (the third metal layer) made of TiN film, WN film, or TaN film is formed on the entire surface including the inside of the piercing hole 10 through CVD method, as shown in FIG. 4. The barrier metal film 14 prevents the diffusion of the metal material of a wiring layer 15 formed inside the piercing hole 10 and the chemical reaction between the metal material and the conduction body (the first metal film 18 in this embodiment).

Figure 5:
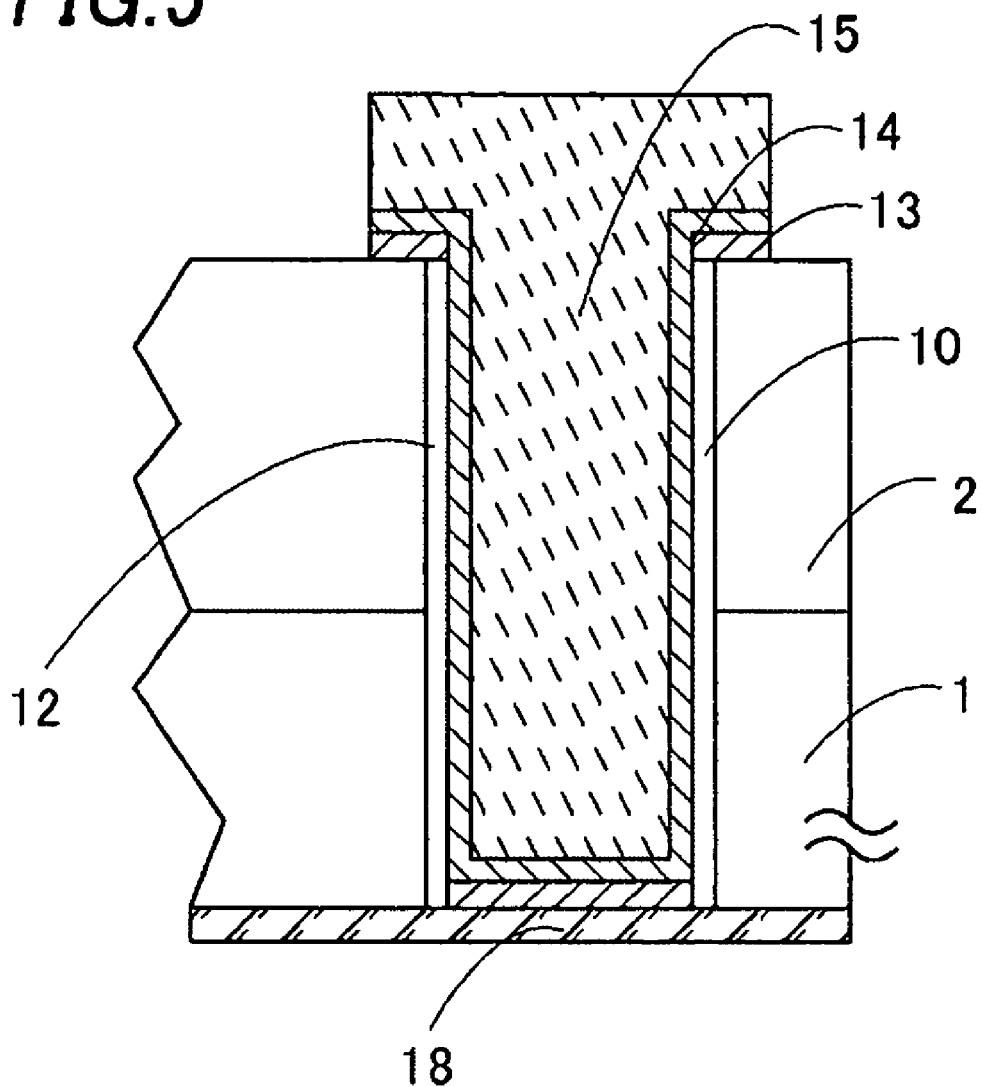

Then, a seed layer (not shown in the figure) made of Cu layer is disposed on the barrier metal film 14 by using a thin film formation methods such as CVD method or sputtering method, as shown in FIG. 5. The seed layer is a conduction layer used as the base electrode for forming the wiring layer 15 through plating. Then, the wiring layer 15 (the fourth metal film) made of Cu layer is formed on the seed layer by using electrolytic plating method.

The semiconductor device 19 which has the first metal film 18 formed on the back surface of the semiconductor substrate 1 is completed. Ti—Ni—Au alloy layer is used as the first metal film 18 in this embodiment. However, other conduction materials with a low resistance value can be used.

An electric current I1 goes through from the source layer 7 (the source electrode S) to the epitaxial layer 2, then goes through inside the semiconductor substrate 1, to the drain layer 11 with the piercing electrode configuration (the drain electrode D) along with the arrow as shown in FIG. 1 in the up-drain type MOS transistor (the semiconductor device 19).

The area in the semiconductor substrate with the high resistance value because of the passage of the electric current is dramatically reduced in this embodiment compared with the case of the conventional semiconductor device 63, leading to the reduced resistance value of the semiconductor device. Since the electric current goes through between the epitaxial layer 52 with the thickness of 200 μm and the semiconductor substrate 51, the one side of the electric current passage is the metal film made from the piercing electrode, accelerating the transmission of the electric current (The resistance value R2 of the semiconductor device 63 of prior arts>the resistance value R1 of the semiconductor device 19 of this embodiment).

Also, the drain layer 11 with the piercing electrode configuration, not the drain layer made of the impurity layer 59, is formed in this embodiment. Therefore, the resistance value can be further lowered. It is also possible to further reduce the resistance value by enlarging the area of the piercing electrode. A plurality of the piercing electrode can be formed.

The capacitance is not built up in the semiconductor device 19 in which electric current goes through in vertical direction (the direction of the thickness of the semiconductor substrate 1) by disposing the insulating film 12 on the side wall inside the piercing hole 10, but not on the epitaxial layer 2 (the region X in the figure). Therefore, the device characteristic of the semiconductor device is improved in this embodiment compared to the case where the insulating film 12 is formed on the epitaxial layer 2.

The second metal film 13 is disposed using a manufacturing method other than CVD method (sputtering method or evaporation method in this embodiment) on the semiconductor layer (the epitaxial layer 2) adjacent to the piercing hole 10 in the semiconductor device 19.

Then, the barrier metal layer 14 is formed through the second metal film 13. Therefore, it is possible to obtain the barrier metal film with the desirable thickness and quality because there is no chemical reaction between the semiconductor substrate and the barrier metal film as in the case where the barrier metal film is formed directly on the semiconductor substrate through CVD method.

Figure 2:
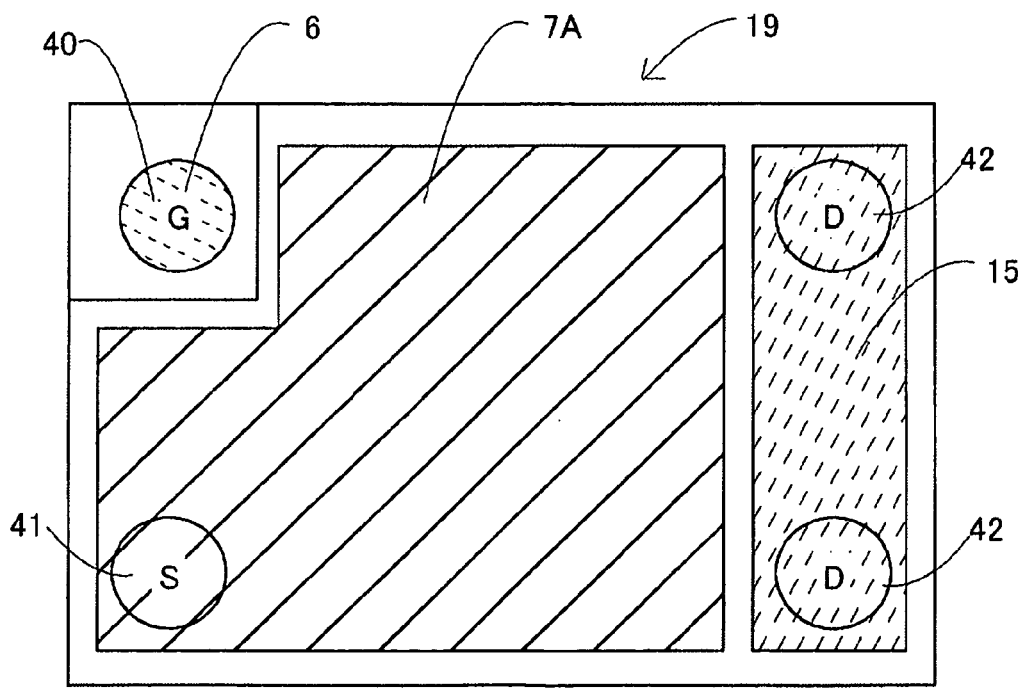
FIG. 2 is the plan view of the semiconductor device of the first embodiment of this invention.

This embodiment enables the flip chip with the low resistance. FIG. 2 is a plan view of the flip chip of this embodiment. The reference numeral 40 in FIG. 2 indicates a bump electrode (G) for the gate electrode 6, the reference numeral 41 a bump electrode (S) for the source electrode 7A, and the reference numeral 42 a bump electrode (D) for the drain electrode, respectively. Additional bump electrodes can also be formed to the extent that will not disturb the flatness of the flip chip.

Next, the second embodiment of this invention will be explained. The piercing hole 10 is formed from the front surface (the surface with device elements are formed) of the semiconductor substrate in the first embodiment. In the second embodiment, the process to form the piercing hole 10 from the back surface of the semiconductor substrate is employed. The detailed explanation will be given hereinafter. The same device elements as those in the first embodiment will be given the same reference numeral, and the explanation about those device elements will be either omitted or simplified.

Figure 6:
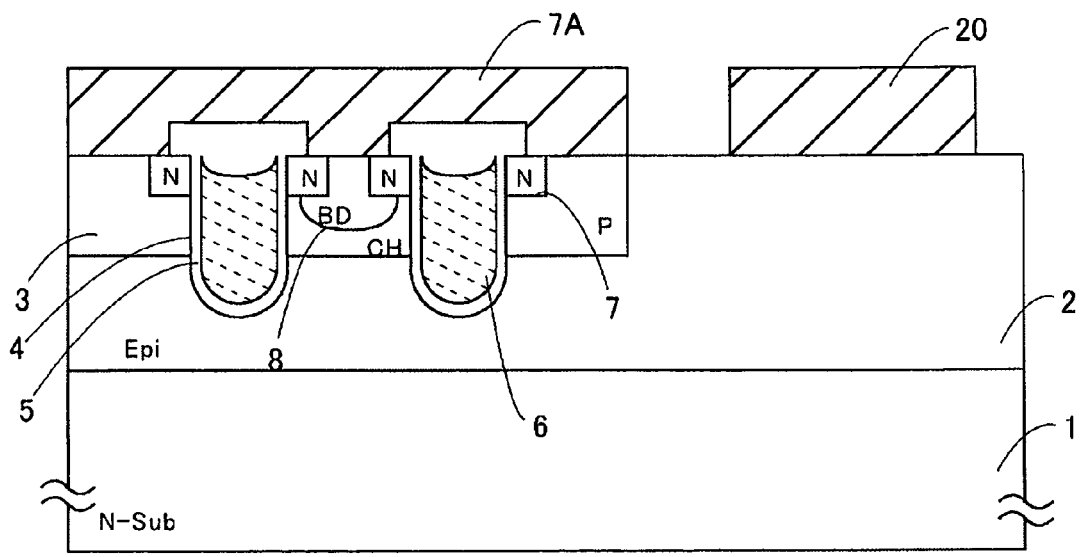
FIGS. 6 to 12 are the cross-sectional views of the manufacturing method of the semiconductor device of the second embodiment of this invention.

The epitaxial layer 2 is disposed on the surface of the N type semiconductor substrate 1 as shown in FIG. 6. The P type diffusion layer 3, the trench 4, the insulating film 5, the gate electrode 6, the source layer 7 and the P type body layer 8 are formed on the surface of the epitaxial layer 2 through the publicly known semiconductor device manufacturing processes.

Next, the source electrode 7A is formed on the source layer 7, and a drain electrode 20 is formed on the surface of the epitaxial layer 2 detached from the P type diffusion layer 3.

Figure 7:
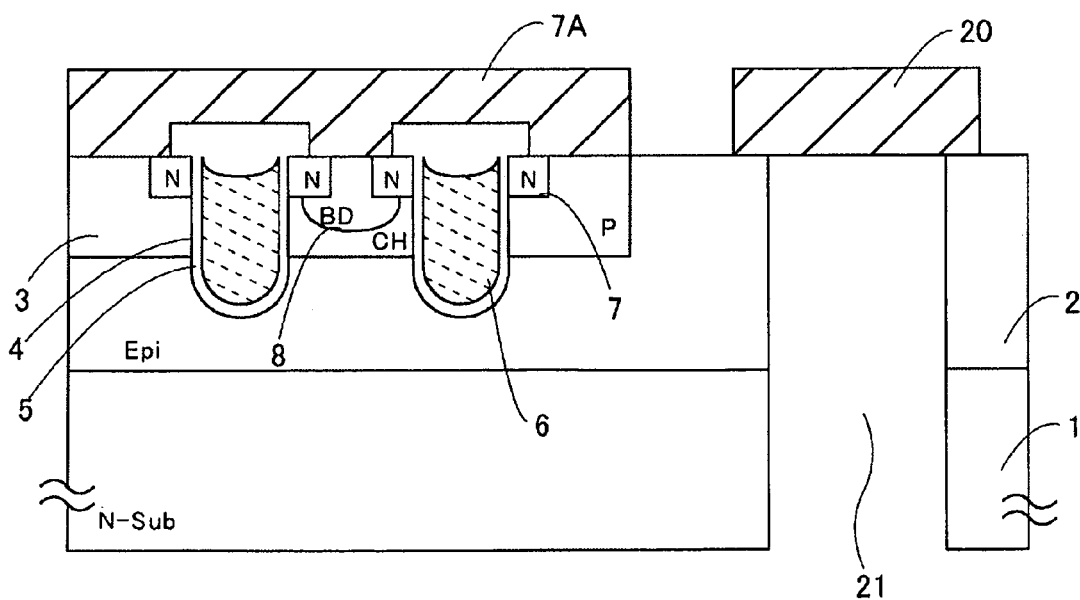

Next, a photo resist layer (not shown in the figure) is formed on the back surface of the semiconductor substrate 1 and etching is performed on the semiconductor substrate 1 using the photo resist layer as a mask. A piercing hole, 21 which pierces the semiconductor substrate 1 from the back surface, is formed at the location corresponding to the drain electrode 20 through the etching process mentioned above, as shown in FIG. 7.

Figure 8:
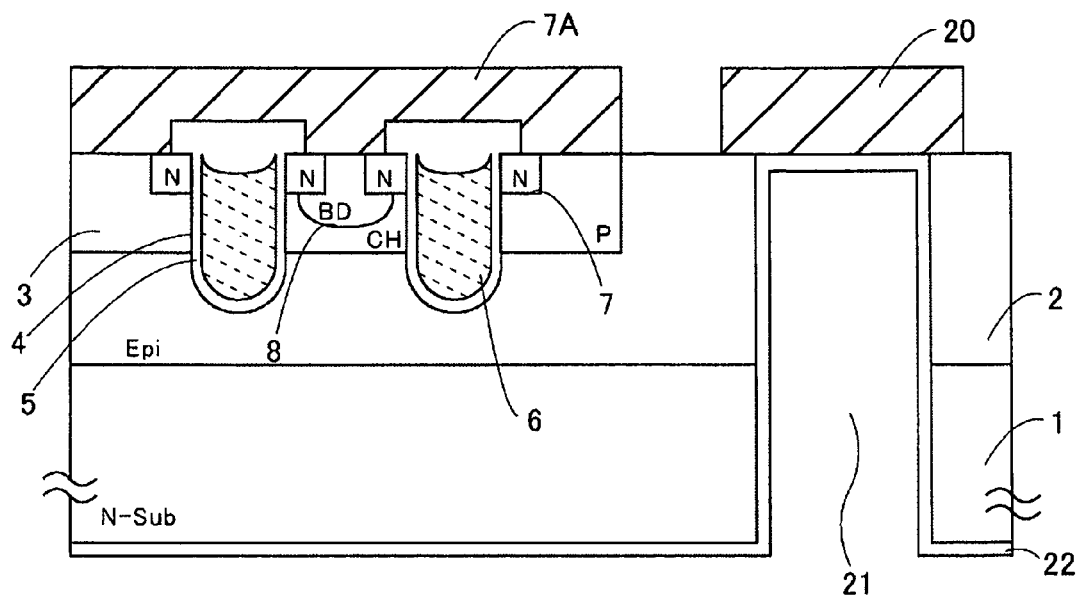

Then, an insulating film 22 is disposed inside of the piercing hole 21 and on the back surface of the semiconductor substrate 1, as seen in FIG. 8. The insulating film 22 can be, for example, a silicon oxide film or a silicon nitride film manufacture through CVD method.

Figure 9:
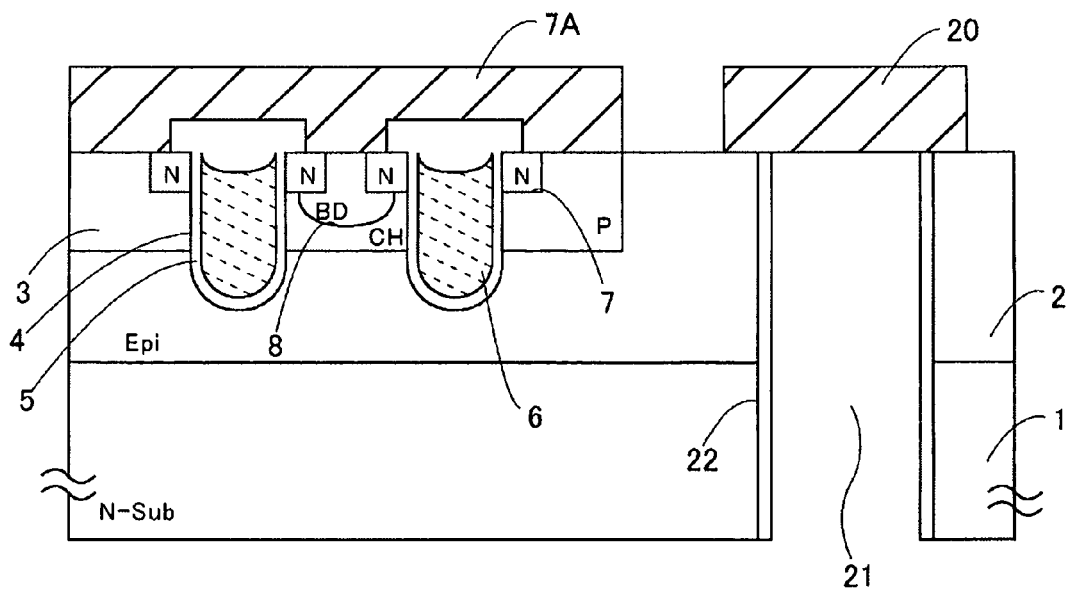

Next, etching process is selectively performed on the insulating film 22 at the bottom of the piercing hole 21 and on the back surface of the semiconductor substrate 1. The only area where the insulating film 22 remains is on the side wall of the piercing hole 21, as shown in FIG. 9. Through this etching process, the drain electrode 20 is exposed at the bottom of the piercing hole 21 and the back surface of the semiconductor substrate 1 is also exposed.

Figure 10:
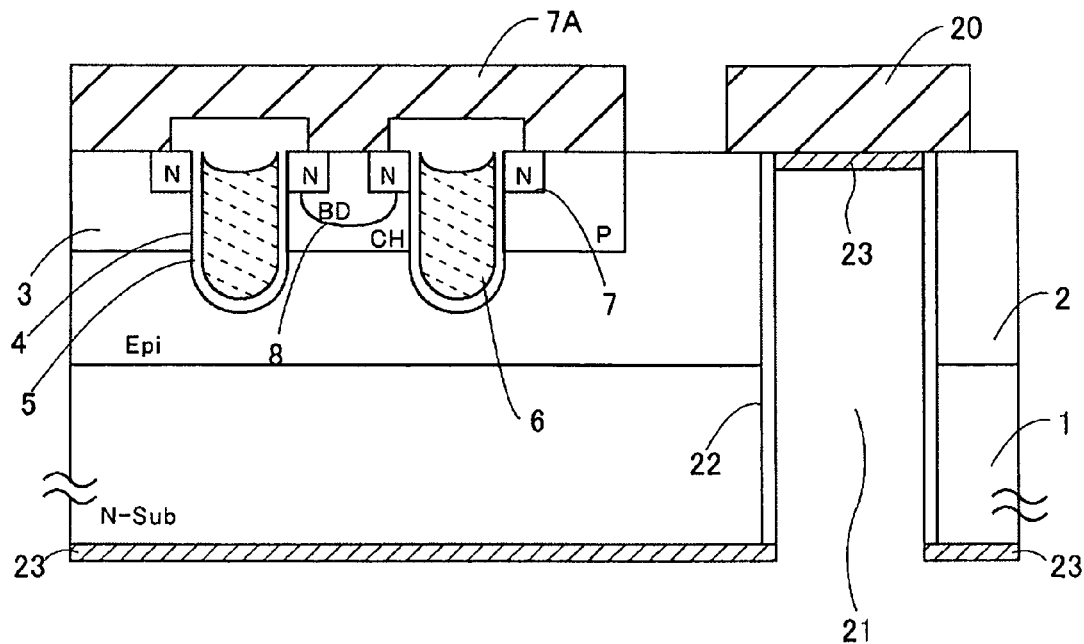
Figure 11:
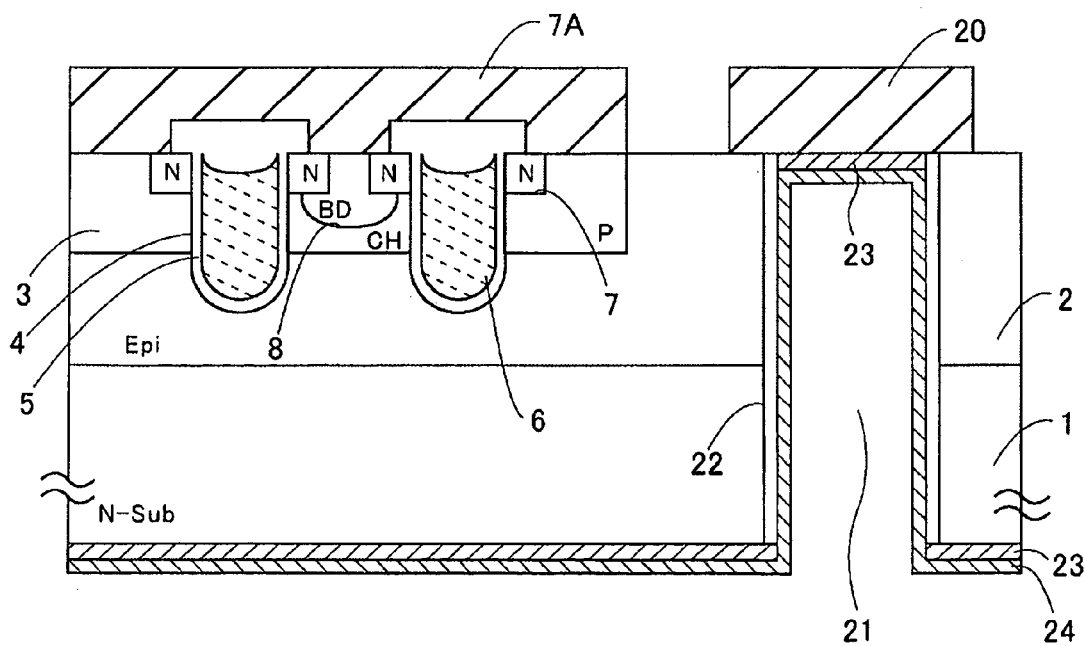

Then, a metal film 23 (for example, Titan (Ti) film) is formed on the drain electrode 20 at the bottom of the piercing hole 21 and on the back surface of the semiconductor substrate 1 by using a thin film formation method other than CVD method (for example, sputtering method or evaporation method), as shown in FIG. 10. The metal film 23 corresponds to the second metal film of this embodiment. The amount of the metal film 23 attached to the side wall of the piercing hole 21 is relatively small when the metal film is formed through sputtering method. Therefore, there is no metal film 23 formed on the side wall of the piercing hole 21 in FIG. 10. The reason why CVD method is not used for the formation of the metal film 23 is that it is difficult to obtain the desirable thickness and quality of the metal film when the metal film is formed directly on the semiconductor substrate through CVD method as it is explained in the section of the first embodiment.

Next, a barrier metal film 24 (for example, TiN film or WN film) is disposed inside the piercing hole 21 and on the back surface of the semiconductor substrate 1 through CVD method. The barrier metal film 24 corresponds to the third metal film of this invention. The barrier metal film 24 is not formed directly on the back surface of the semiconductor substrate 1, but through the metal film 23. That is, the chemical reaction does not occur between the back surface of the semiconductor substrate 1 and the CVD gas because the metal film 23 and the insulating film 22 function as a barrier when the barrier metal film 24 is disposed on the back surface of the semiconductor substrate 1. Therefore, the barrier metal film 24 with the desirable thickness and quality can be acquired. Then, a seed layer (not shown in the figure) made of, for example, copper is formed to cover the entirety of the barrier metal film 24.

Figure 12:
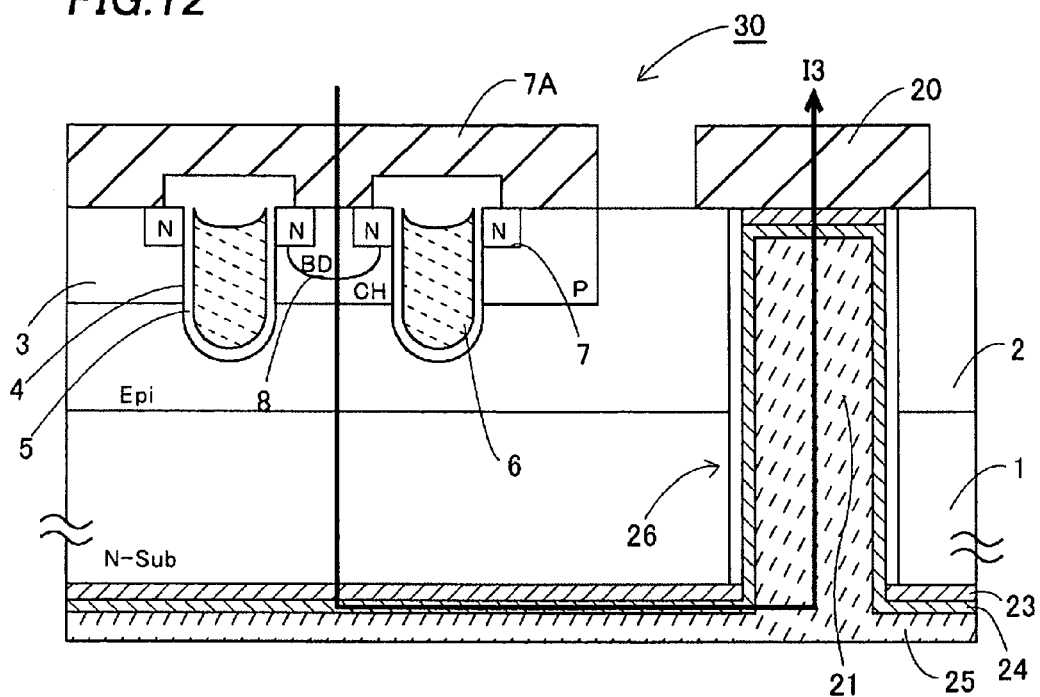
Figure 13:
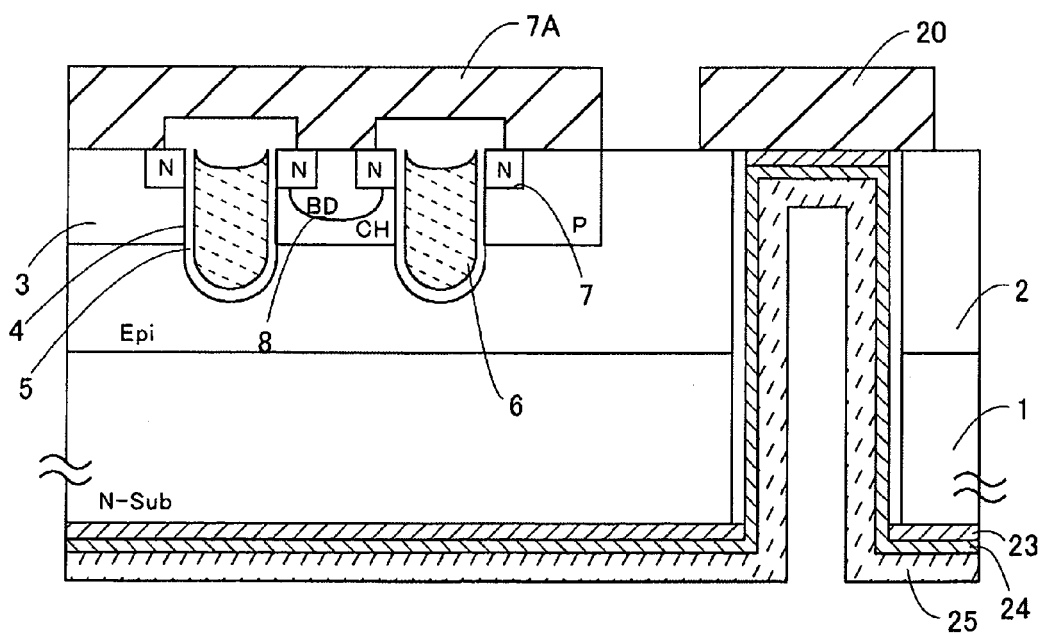
FIG. 13 is the cross-sectional view of the manufacturing method of the semiconductor device of another embodiment of this invention.

A wiring layer 25 made of, for example, copper is formed inside the piercing hole 21 and on the back surface of the semiconductor substrate 1 through electrolytic plating method with the seed layer used as the plating electrode, as shown in FIG. 12. The wiring layer 25 is electrically connected to the back surface of the semiconductor substrate 1 and the drain electrode 20 though the seed layer, the barrier metal film 24 and the metal film 23. All the conductor materials formed inside the piercing hole 21 (the metal film 23, the barrier metal film 24 and the wiring layer 25) configure the drain layer 26 in this embodiment. Then, a bump electrode and a protecting film made of resist material shown in the FIG. 2 are formed according to the necessity on the source electrode 7A and the drain electrode 20.

Next, the cutting along with the predetermined cutting line is performed, separating into the individual semiconductor device 30. The methods for separating into individual semiconductor device 30 include a dicing method, an etching method and a leaser-cut method.

Electric current I3 goes through from the source layer 7 to the drain layer 26 with the piercing electrode configuration along with the arrow shown in FIG. 12 in the semiconductor device 30.

Figure 14:
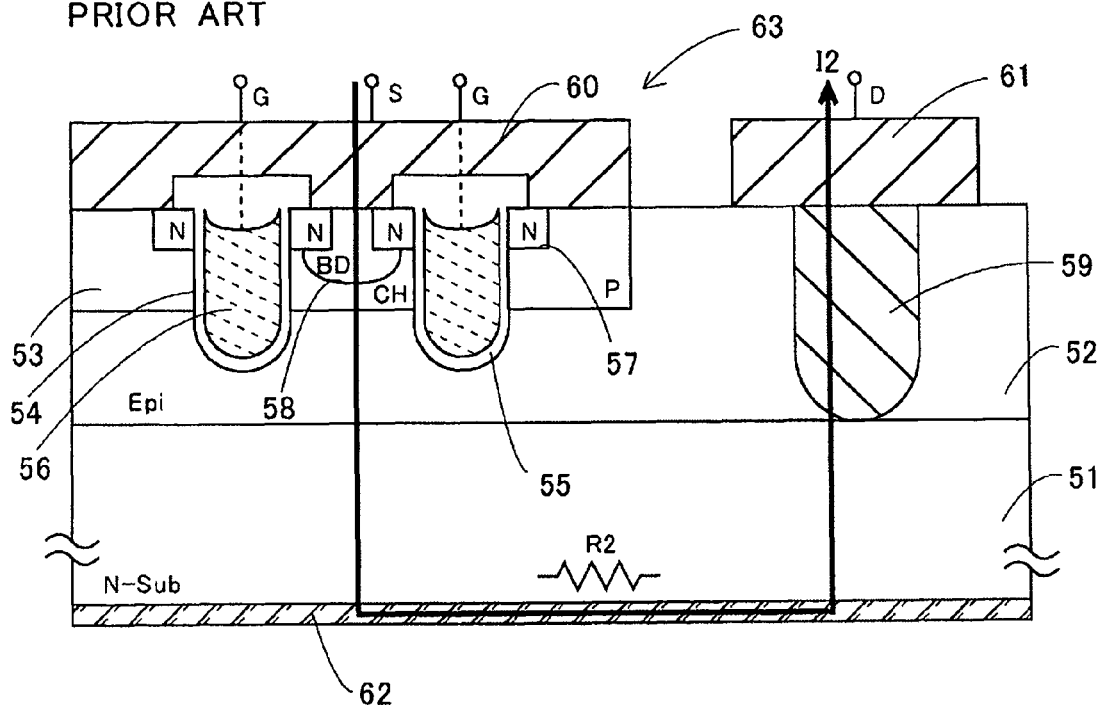
FIG. 14 is the cross-sectional view of the semiconductor device of prior arts.

Lowering the resistance value at the electric current passage is also achieved in this second embodiment, because there is the drain layer 26 formed inside the piercing hole 21, compared to the configuration of the prior arts (FIG. 14).

This invention is not limited to the first and the second embodiments. It can be modified within the scope of this invention.

For example, the wiring layer (15, 25) does not have to completely fill the piercing hole (10, 21). It is possible for the wiring layer to fill the piercing hole partially. Also, a supporting body, such as a glass substrate can be put on the surface of the semiconductor substrate 1 before forming the piercing hole 21 in the second embodiment. Then, the piercing hole 21, the metal film 23, the barrier metal film 24, and the wiring layer 25 can be disposed. It is for protecting the surface (the surface with the device elements) of the semiconductor substrate 1 as well as for supporting the semiconductor substrate 1 firmly. Then, the supporting body may be removed, according to necessity, after the formation of the drain layer 26 if additional processing is required on the semiconductor substrate 1.

This invention can be applied to the BGA (Ball Grid Array) type semiconductor device with ball shape terminals, the LGA (Land Grid Array) type semiconductor device, and the CSP (Chip Size Package) type semiconductor device.

The drain layer in the semiconductor device of the embodiments is not configured from an impurity layer, it is formed from a piercing electrode configuration, achieving a lower resistance value. An insulating film is formed on the side wall inside the piercing hole, but not on the semiconductor layer. Therefore, a capacitance is not built up at the passage of the electric current, since electric current goes through in longitudinal direction (the direction of the thickness of the semiconductor layer) in the semiconductor device with this configuration, improving the device characteristics of the semiconductor device. The desirable barrier metal film with the desirable thickness and quality can be obtained when the barrier metal film is formed by sputtering method or an evaporation method through a metal film, not formed directly on the semiconductor substrate.

What is claimed is:

1. A semiconductor device comprising:
   a semiconductor substrate of a first general conductivity type having a piercing hole piercing the substrate from a front surface thereof to a back surface thereof;
   a source layer formed in the front surface of the substrate;
   a drain electrode disposed on the front surface of the substrate to cover the piercing hole;
   a metal film disposed on the back surface of the substrate so as to make a direct contact with the back surface of the substrate; and
   a drain wiring disposed inside the piercing hole and electrically connected with the drain electrode, the drain wiring covering the metal film,
   wherein the drain wiring comprises a wiring layer and a barrier metal film disposed between the wiring layer and a sidewall of the piercing hole, the barrier metal film covers the metal film, the wiring layer is physically in contact with the barrier metal film, the metal film is disposed on the back surface of the substrate so that the barrier metal film is not in contact with the back surface of the substrate, and part of the metal film is disposed between the drain electrode and the drain wiring so as to be physically in contact with the drain electrode.

2. The semiconductor device of claim 1, further comprising a first insulating film disposed on the sidewall of the piercing hole.

3. The semiconductor device of claim 2, wherein the semiconductor substrate comprises an epitaxial layer formed on a silicon substrate, an impurity diffusion layer of a second general conductivity type formed in the epitaxial layer, a trench extending from a surface of the impurity diffusion layer into the epitaxial layer, a gate electrode comprising a conduction layer buried in the trench and a second insulating film disposed between the conduction layer and a wall of the trench, and the source layer is formed in the impurity diffusion layer adjacent the trench.

4. The semiconductor device of claim 1, wherein the drain wiring does not completely fill the piercing hole.

5. The semiconductor device of claim 1, wherein the metal film is a metal film formed by a sputtering method or an evaporation method.

6. The semiconductor device of claim 1, wherein the barrier metal is titanium nitride, tungsten nitride or tantalum nitride.

7. The semiconductor device of claim 6, wherein the metal film comprises titanium, chromium, vanadium, tantalum, tungsten or zirconium.

8. The semiconductor device of claim 1, wherein the drain wiring and the metal film extend on the back surface of the substrate so as to overlap the source layer so that a current path from the source layer to the drain wiring is the shortest.

* * * * *